United States Patent
Sawada

(10) Patent No.: US 7,327,195 B2
(45) Date of Patent: Feb. 5, 2008

(54) PLL FREQUENCY SYNTHESIZER

(75) Inventor: Akihiro Sawada, Osaka (JP)

(73) Assignee: Matsushita Electric Industrial Co., Ltd., Osaka (JP)

(\*) Notice: Subject to any disclaimer, the term of this patent is extended or adjusted under 35 U.S.C. 154(b) by 111 days.

(21) Appl. No.: 10/559,867

(22) PCT Filed: May 12, 2005

(86) PCT No.: PCT/JP2005/008708

§ 371 (c)(1),
(2), (4) Date: Dec. 7, 2005

(87) PCT Pub. No.: WO2006/022054

PCT Pub. Date: Mar. 2, 2006

(65) Prior Publication Data

US 2007/0096834 A1    May 3, 2007

(30) Foreign Application Priority Data

Aug. 27, 2004 (JP) .............................. 2004-247794

(51) Int. Cl.
*H03L 7/00* (2006.01)
(52) U.S. Cl. ..................... 331/16; 331/17; 331/34; 331/177 R; 327/157
(58) Field of Classification Search ........... 331/16, 331/17, 177 R, 34; 327/157
See application file for complete search history.

(56) References Cited

U.S. PATENT DOCUMENTS 5,933,037 A \* 8/1999 Momtaz ..................... 327/157

FOREIGN PATENT DOCUMENTS

| JP | 10-107628 A | 4/1998 |
|----|-------------|--------|
| JP | 10-154934 A | 6/1998 |
| JP | 11-251902 A | 9/1999 |
| JP | 2000-13220 A | 1/2000 |

\* cited by examiner

*Primary Examiner*—Arnold Kinkead
(74) *Attorney, Agent, or Firm*—McDermott Will & Emery LLP

(57) ABSTRACT

A PLL frequency synthesizer is provided with a linearization circuit 6 which receives an oscillation frequency control signal $V_T$ from a loop filter LF. The linearization circuit 6 outputs a charge pump current control signal $CP_{CONT}$, depending on a potential level of the oscillation frequency control signal $V_T$. The larger the value of the charge pump current control signal $CP_{CONT}$, the higher the potential level. A charge pump CP receives the charge pump current control signal $CP_{CONT}$, and causes a current corresponding to the value to flow in or out. Therefore, with a simple circuit structure, loop gain characteristics of the PLL frequency synthesizer can be regulated to be constant. Therefore, even when a variable capacitance element incorporated in a voltage control oscillator has nonlinear characteristics with respect to the potential of the input oscillation frequency control signal, the loop gain characteristics of the PLL frequency synthesizer having the voltage control oscillator can be regulated to be constant.

6 Claims, 10 Drawing Sheets

PLL FREQUENCY SYNTHESIZER

RELATED APPLICATION

This application is the U.S. National Phase under 35 U.S.C. §371 of International Application No. PCT/JP2005/008708, filed on May 12, 2005, which in turn claims the benefit of Japanese Application No. 2004-247794, filed on Aug. 27, 2004, the disclosures of which Applications are incorporated by reference herein.

TECHNICAL FIELD

The present invention relates to a PLL frequency synthesizer for use in a semiconductor integrated circuit in the field of wireless communications and for generating a local signal required for transmission/reception of radio wave. More particularly, the present invention relates to an improvement in characteristics of the PLL frequency synthesizer.

BACKGROUND ART

A structure of a conventional PLL frequency synthesizer is illustrated in FIG. 11.

The conventional PLL frequency synthesizer of FIG. 11 comprises a voltage control oscillator VCO, a programmable frequency divider DIV, a phase comparator PFD, a charge pump circuit CP, and a loop filter LF.

The voltage control oscillator VCO changes an oscillation frequency, depending on a potential of an oscillation frequency control signal $V_T$ (described below). The frequency divider DIV divides the oscillation frequency from the voltage control oscillator VCO with a frequency division ratio corresponding to an externally input channel selection signal. The phase comparator PFD detects a difference in phase between an output signal $f_{DIV}$ from the frequency divider DIV and an externally input reference signal $f_{REF}$, and outputs a phase difference signal. The charge pump circuit CP causes a current to flow into or out of an output point, depending on the phase difference signal from the phase comparator PFD. The loop filter LF filters out a high frequency component of an output current from the charge pump circuit CP, and converts the output current into a direct current voltage value. An output of the loop filter LF is fed as the oscillation frequency control signal $V_T$ back to the voltage control oscillator VCO.

An output frequency $f_{out}$ of the thus-constructed conventional PLL frequency synthesizer is represented by a frequency represented by expression 1 below using a frequency $f_{ref}$ of the reference signal and a division ratio N of the program frequency divider DIV.

$$f_{out} = N \cdot f_{ref} \qquad (1)$$

In actual radio transmitter-receivers, a predetermined output frequency $f_{out}$ is obtained by changing the frequency $f_{ref}$ of the reference signal or the frequency division ratio N, or both of them, and a signal of the output frequency $f_{out}$ is used as a local signal for transmission/reception of a radio signal.

An open loop gain GH(s) of the PLL frequency synthesizer is represented by expression 2 below.

$$GH(s) = K_p \cdot Z_{lf}(s) \cdot \frac{K_{VCO}}{s} \cdot \frac{1}{N} \qquad (2)$$

In expression 2, $K_{VCO}$ is a sensitivity of the voltage control oscillator VCO, N is a frequency division number, $Z_{lf}(s)$ is a transfer function of a loop filter, $K_p$ is a conversion gain of the phase comparator PFD and the charge pump circuit CP. The conversion gain $K_p$ is represented by expression 3 below, where a charge pump current is indicated by $I_{CP}$.

$$K_p = \frac{I_{CP}}{2\pi} \qquad (3)$$

The sensitivity $K_{VCO}$ of the voltage control oscillator VCO is represented by a proportion of a change in oscillation frequency with respect to a change in the input oscillation frequency control signal $V_T$. In an LC-type voltage control oscillator LC-VCO which is generally used as a PLL frequency synthesizer of a wireless communications apparatus, the oscillation frequency control signal $V_T$ is output to a variable capacitor, and the capacitance value of the variable capacitor varies depending on a voltage of the oscillation frequency control signal $V_T$, thereby changing an oscillation frequency of the voltage control oscillator VCO.

Here, the variable capacitance characteristics of a MOS-type variable capacitor which is frequently used as a variable capacitor or a p-n junction-type variable capacitor are generally nonlinear with respect to an input (i.e., the oscillation frequency control signal $V_T$). As a result, the oscillation frequency characteristics of the voltage control oscillator VCO are also nonlinear with respect to the input oscillation frequency control signal $V_T$. A general voltage control oscillator VCO which employs a j-n junction capacitor as a variable capacitor has characteristics of an oscillation frequency $f_{VCO}$ as illustrated in FIG. 12(a), and characteristics of the sensitivity $K_{VCO}$ as illustrated in FIG. 12(b). Here, the charge pump current $I_{CP}$ is a constant current as illustrated in FIG. 12(c). Therefore, the open loop gain GH(s) of the PLL frequency synthesizer having such a voltage control oscillator VCO is nonlinear as illustrated in FIG. 12(d), so that the loop gain characteristics of the whole PLL frequency synthesizer varies depending on the potential of the oscillation frequency control signal $V_T$. The variation of the loop gain characteristics due to the potential of the oscillation frequency control signal $V_T$ is responsible for variation of a lock-up time, variation of phase noise characteristics, and the like, i.e., degradation of characteristics.

In order to solve the above-described problem, a conventional technique is proposed in Patent Document 1. In this technique, the oscillation frequency control signal $V_T$ is A/D converted, and a transient response in a convergence process of the PLL frequency synthesizer is detected by high-speed sampling using a DSP (Digital Signal Processor) to obtain the sensitivity $K_{VCO}$ of the voltage control oscillator VCO, and based on the result, the conversion gain $K_p$ of the phase comparator PFD and the charge pump circuit CP is changed, thereby causing the transfer characteristics of the PLL frequency synthesizer to be constant.

Patent Document 1: Japanese Patent Unexamined Publication No. H10-154934

DISCLOSURE OF THE INVENTION

Problems to be Solved by the Invention

However, in the conventional technique, an A/D converter, a DSP, and a D/A converter are required, so that the cost and the circuit area are significantly increased, and the circuit area of the whole PLL frequency synthesizer is inevitably increased. Therefore, the cost and size of a product into which the PLL frequency synthesizer is incorporated are increased. In addition, noise which is generated in these circuits leads to a deterioration in characteristics of the PLL frequency synthesizer.

The present invention is provided to solve the above-described conventional problem. An object of the present invention is to minimize a variation in loop characteristics of a PLL frequency synthesizer without leading to a deterioration in characteristics of the PLL frequency synthesizer while suppressing increases in the area and cost.

Solution to the Problems

To achieve the above-described object, the present invention employs a simple structure which changes a conversion gain of a phase comparator and a charge pump circuit without employing an A/D converter, a DSP, or a D/A converter which are used in conventional techniques.

Specifically, a PLL frequency synthesizer according to the present invention comprises a voltage control oscillator of changing an oscillation frequency, depending on a potential of an oscillation frequency control signal, a frequency divider of dividing the oscillation frequency from the voltage control oscillator with a predetermined frequency division ratio, a phase comparator of receiving an output signal from the frequency divider and an external reference signal, detecting a difference in phase between the output signal and the reference signal, and outputting a phase difference signal, a charge pump circuit of causing a constant current to flow in or out, depending on the phase difference signal from the phase comparator, a loop filter of filtering out a high frequency component of an output of the charge pump circuit, converting the current flowing into or out of the charge pump circuit into a voltage, and outputting the voltage as the oscillation frequency control signal, and a linearization circuit of controlling a conversion gain of the phase comparator and the charge pump circuit so as to compensate for nonlinearity of a loop gain of the PLL frequency synthesizer with respect to the oscillation frequency control signal.

In the PLL frequency synthesizer of the present invention, the linearization circuit receives the oscillation frequency control signal from the loop filter, and continuously controls the conversion gain of the phase comparator and the charge pump circuit, depending on the potential of the oscillation frequency control signal.

In the PLL frequency synthesizer of the present invention, the linearization circuit has a transistor, a current flowing through the transistor varying depending on the potential of the oscillation frequency control signal from the loop filter, and the linearization circuit continuously controls the conversion gain of the phase comparator and the charge pump circuit, depending on a value of the current flowing through the transistor.

In the PLL frequency synthesizer of the present invention, the transistor of the linearization circuit is composed of a plurality of transistors, and the conversion gain of the phase comparator and the charge pump circuit is continuously controlled, depending on a sum of currents flowing through the plurality of transistors.

In the PLL frequency synthesizer of the present invention, the plurality of transistors of the linearization circuit have different threshold voltages from each other.

In the PLL frequency synthesizer of the present invention, the linearization circuit has a bias voltage generating circuit of generating a bias voltage, the bias voltage of the bias voltage generating circuit is input to a source of the transistor of the linearization circuit, and the oscillation frequency control signal from the loop filter is input to a gate of the transistor, and the conversion gain of the phase comparator and the charge pump circuit is continuously controlled, depending on a value of the current flowing through the transistor.

In the PLL frequency synthesizer of the present invention, the transistor of the linearization circuit is composed of a plurality of transistors, and the conversion gain of the phase comparator and the charge pump circuit is continuously controlled, depending on a sum of currents flowing through the plurality of transistors.

In the PLL frequency synthesizer of the present invention, the bias voltage generating circuit generates a plurality of different bias voltages, and the different bias voltages from the bias voltage generating circuit are input to respective sources of the plurality of transistors of the linearization circuit.

In the PLL frequency synthesizer of the present invention, the bias voltage generating circuit changes the plurality of generated bias voltages based on an externally input bias voltage setting signal.

In the PLL frequency synthesizer of the present invention, the plurality of transistors of the linearization circuit are composed of a P-type or N-type MOS transistor or P-type and N-type MOS transistors.

In the PLL frequency synthesizer of the present invention, the linearization circuit comprises a voltage-current conversion circuit of converting a voltage of the oscillation frequency control signal from the loop filter into a current, and a charge pump current control circuit of receiving the current from the voltage-current conversion circuit, generating a charge pump current control signal corresponding to a value of the received current, and outputting the charge pump current control signal to the charge pump circuit. The charge pump circuit regulates a flowing current based on the charge pump current control signal from the charge pump current control circuit.

Thus, according to the present invention, the linearization circuit continuously controls the conversion gain of the phase comparator and the charge pump circuit, depending on, for example, the potential of the oscillation frequency control signal from the loop filter. Therefore, the loop gain characteristics of the PLL frequency synthesizer can be regulated to be constant without depending on the potential of the oscillation frequency control signal, using a relatively simple structure employing the linearization circuit, and without using an A/D converter, a DSP, or a D/A converter which are used in conventional techniques.

Particularly, in the present invention, the linearization circuit controls the conversion gain of the phase comparator and the charge pump circuit by utilizing a change in the current drive ability of a transistor with respect to an input voltage. Therefore, with the simpler structure, the loop gain characteristics of the PLL frequency synthesizer can be regulated to be constant.

Effect of the Invention

As described above, according to the present invention, the linearization circuit is used so as to continuously control the conversion gain of the phase comparator and the charge pump circuit. Therefore, with a structure simpler than conventional structures, the loop gain characteristics of the PLL frequency synthesizer can be regulated to be constant. Therefore, a variation in lock-up time, a variation in phase noise characteristics, and the like can be suppressed over a broad band. Therefore, an inexpensive and high-performance broad-band PLL frequency synthesizer required in the field of broad-band wireless communications can be provided.

Particularly, according to the present invention, the loop gain characteristics of the PLL frequency synthesizer can be regulated to be constant using a simpler structure.

DESCRIPTION OF THE REFERENCE CHARACTERS

VCO voltage control oscillator
VIV programmable frequency divider
PED phase comparator
CP charge pump circuit
LF loop filter
6, 6', 6'', 6''', 6'''' linearization circuit
7, 7', 7'', 7''', 7'''' V-I conversion circuit (voltage-current conversion circuit)
8, 8' CP bias control circuit (charge pump current control circuit)
MN1, MN1A, MN1B N-type transistor (transistor)
$V_T$ oscillation frequency control signal
$CP_{CONT}$ charge pump current control signal

BEST MODE FOR CARRYING OUT THE INVENTION

Hereinafter, PLL frequency synthesizers according to embodiments of the present invention will be described with reference to the accompanying drawings.

First Embodiment

Figure 1:
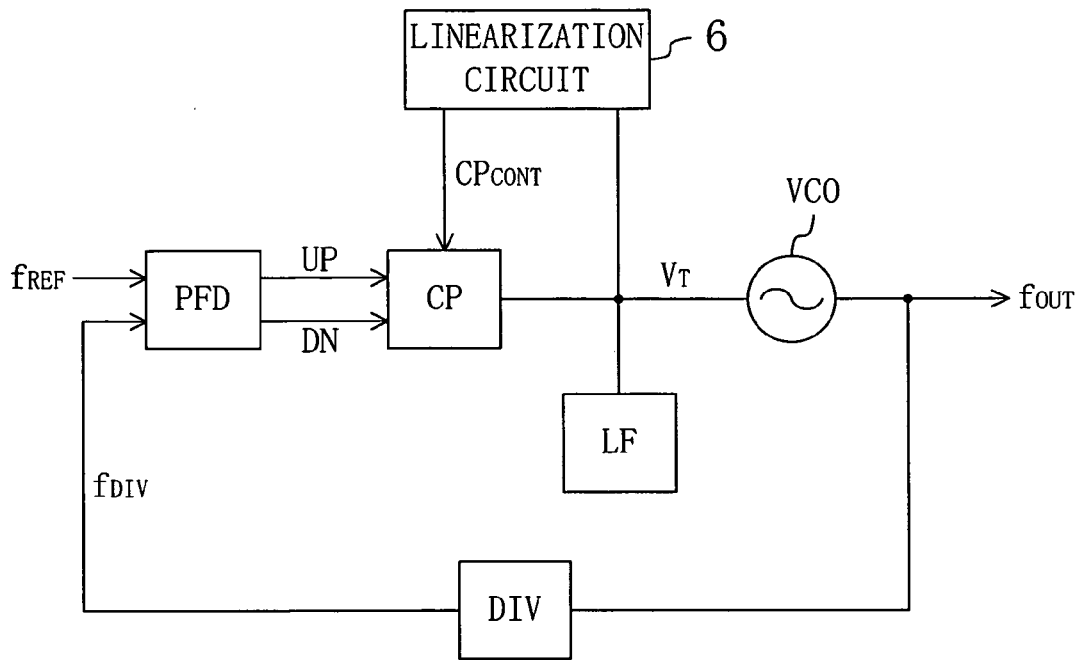
FIG. 1 illustrates a structure of a PLL frequency synthesizer according to a first embodiment of the present invention.

FIG. 1 illustrates a structure of a PLL frequency synthesizer according to a first embodiment of the present invention.

In FIG. 1, the PLL frequency synthesizer comprises a voltage control oscillator VCO, a programmable frequency divider DIV, a phase comparator PFD, a charge pump circuit CP, and a loop filter LF.

The voltage control oscillator VCO changes an oscillation frequency, depending on a voltage of an oscillation frequency control signal $V_T$. The frequency divider DIV divides an oscillation frequency $f_{OUT}$ from the voltage control oscillator VCO with a frequency division ratio corresponding to an externally input channel selection signal. The phase comparator PFD detects a difference in phase between an output signal $f_{DIV}$ from the frequency divider DIV and an externally input reference signal $f_{REF}$, and outputs a phase difference signal. The charge pump circuit CP causes a current to flow into or out of an output point, depending on the phase difference signal from the phase comparator PFD. The loop filter LF filters out high frequency components of an output current from the charge pump circuit CP, and converts the output current into a direct current voltage value. An output of the loop filter LF is fed as the oscillation frequency control signal $V_T$ back to the voltage control oscillator VCO.

In the first embodiment of the present invention, a linearization circuit 6 is further provided which continuously controls a conversion gain $K_p$ of the phase comparator PFD and the charge pump circuit CP so as to compensate for nonlinearity of a sensitivity (specifically, a proportion of a change in the output oscillation frequency $f_{OUT}$) of the voltage control oscillator VCO with respect to the oscillation frequency control signal $V_T$. Hereinafter, the linearization circuit 6 will be described.

Figure 2:
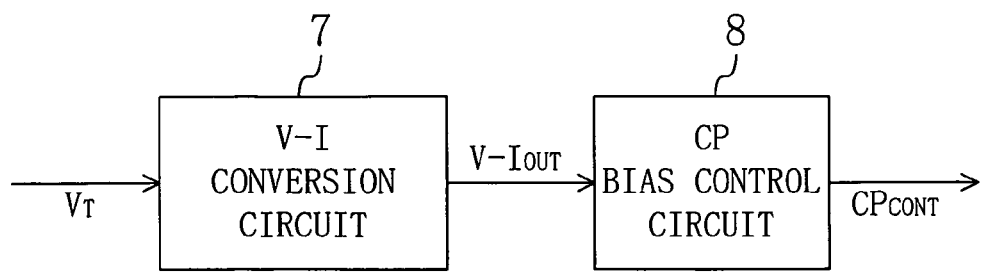
FIG. 2 is a diagram illustrating a structure of a linearization circuit included in the PLL frequency synthesizer.

An internal structure of the linearization circuit 6 is illustrated in FIG. 2. The linearization circuit 6 of FIG. 2 comprises a V-I conversion circuit (voltage-current conversion circuit) 7 and a charge pump bias current control circuit (hereinafter abbreviated as a CP bias control circuit) 8. The V-I conversion circuit 7 receives the oscillation frequency control signal $V_T$ from the loop filter LF, and converts a potential level of the oscillation frequency control signal $V_T$ into a current value V-$I_{OUT}$ corresponding to the potential level. The CP bias control circuit (charge pump current control circuit) 8 outputs a charge pump current control signal $CP_{CONT}$ which controls a bias current value of a charge pump current $I_{CP}$ of the charge pump circuit CP, depending on the current value V-$I_{OUT}$ obtained by the V-I conversion circuit 7.

Figure 3:
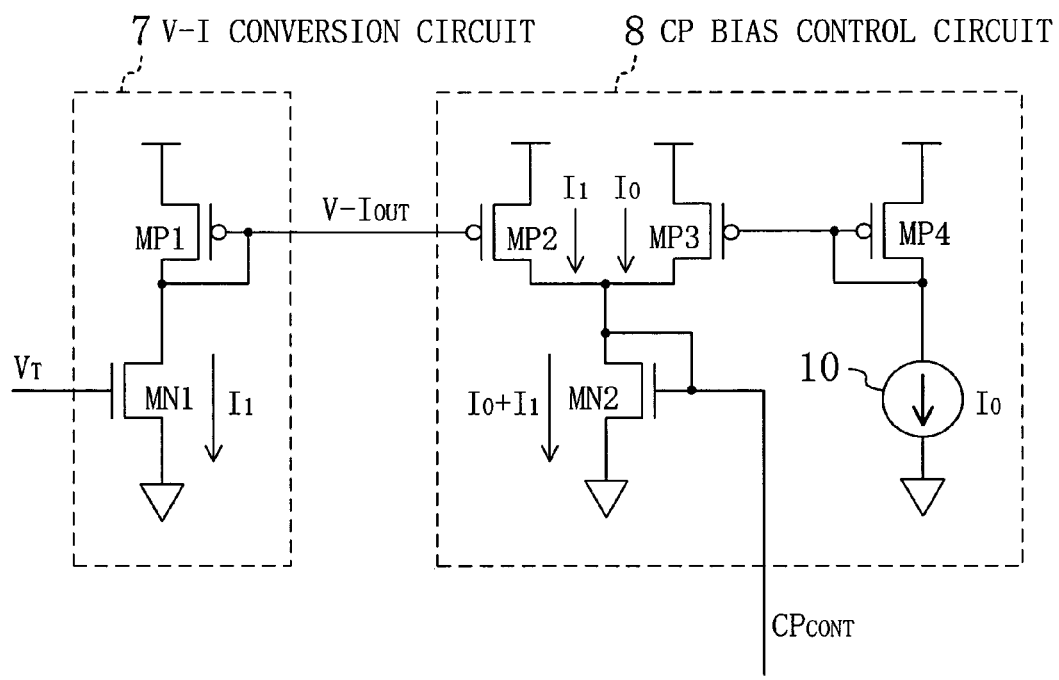
FIG. 3 is a diagram illustrating a specific structure of the linearization circuit.

Specific internal structures of the V-I conversion circuit 7 and the CP bias control circuit 8 in the linearization circuit 6 of FIG. 2 are illustrated in FIG. 3. Referring to FIG. 3, in the V-I conversion circuit 7, a series circuit of a P-type transistor MP1 and an N-type transistor MN1 is provided between a power source and a ground. The oscillation frequency control signal $V_T$ is input from the loop filter LF to a gate of the N-type transistor MN1, and a value of a current $I_1$ which flows through the N-type transistor MN1 varies depending on a potential of the oscillation frequency control signal $V_T$. Specifically, as the potential of the oscillation frequency control signal $V_T$ is increased, the current drive capability of the N-type transistor MN1 increases, resulting in an increase in the current value $I_1$.

In the CP bias control circuit 8 of FIG. 3, a P-type transistor MP2 is provided, and the P-type transistor MP2 and the P-type transistor MP1 of the V-I conversion circuit 7 constitute a current mirror circuit, which mirrors the current value $I_1$ flowing through the N-type transistor MN1 of the V-I conversion circuit 7, so that the current value $I_1$ is input to the CP bias control circuit 8. The CP bias control circuit 8 also comprises a current mirror circuit composed of two P-type transistors MP3 and MP4 and a reference current source 10, which generate a current $I_0$. The current $I_0$ and the input current value $I_1$ (a total current value $I_0+I_1$) is caused to flow through an N-type transistor MN2, and the current value $I_0+I_1$ is supplied as the charge pump current control signal $CP_{CONT}$ from a node (a gate electrode of the N-type transistor MN2) to the charge pump circuit CP of FIG. 1 so that the charge pump current $I_{CP}$ of the charge pump circuit CP is controlled. For example, a current proportional to a value of the charge pump current control signal $CP_{CONT}$ may be caused to flow from the charge pump circuit CP, though the drawings do not illustrate how to control the charge pump current $I_{CP}$ using the charge pump current control signal $CP_{CONT}$.

FIG. 4 illustrates loop gain characteristics of each part of and the whole PLL frequency synthesizer of the first embodiment of the present invention. FIG. 4(a) illustrates characteristics of the oscillation frequency $f_{VCO}$ of a general voltage control oscillator VCO which employs a p-n junction-type variable capacitor. FIG. 4(b) illustrates characteristics of the sensitivity $K_{VCO}$ of the voltage control oscillator VCO. As can be seen from FIGS. 4(a) and 4(b), a proportion of a change in the oscillation frequency $f_{VCO}$, and the sensitivity $K_{VCO}$ decreases with an increase in the potential of the oscillation frequency control signal $V_T$. FIG. 4(c) illustrates current characteristics of the charge pump circuit CP. A dashed line illustrated in FIG. 4(c) indicates the charge pump current $I_{CP}$ of the conventional example of FIG. 1, which has a constant value. In the first embodiment of the present invention, as illustrated with a solid line, the charge pump current $I_{CP}$ increases with an increase in the potential of the oscillation frequency control signal $V_T$, due to the linearization circuit 8. Therefore, as illustrated in FIG. 4(d), characteristics of the loop gain GH(s) of the whole PLL frequency synthesizer are proportional to the characteristics of the sensitivity $K_{VCO}$ of the voltage control oscillator VCO multiplied by the current $I_{CP}$ of the charge pump circuit CP.

Figure 4A:
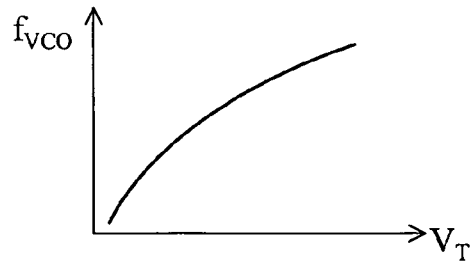
FIG. 4(a) is a diagram illustrating oscillation frequency characteristics of a voltage control oscillator included in the PLL frequency synthesizer of the first embodiment of the present invention.
Figure 4B:
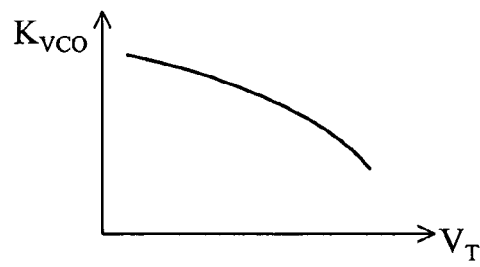
FIG. 4(b) is a diagram illustrating sensitivity characteristics thereof.
Figure 4C:
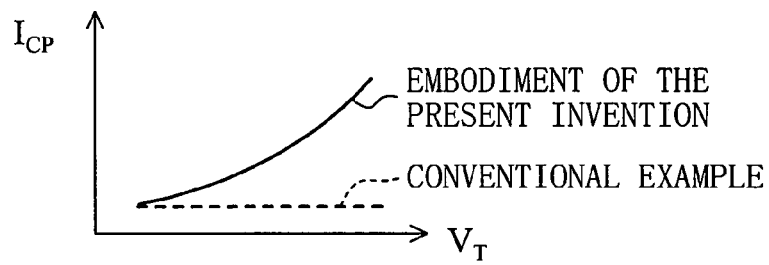
FIG. 4(c) is a diagram illustrating charge pump current characteristics thereof.
Figure 4D:
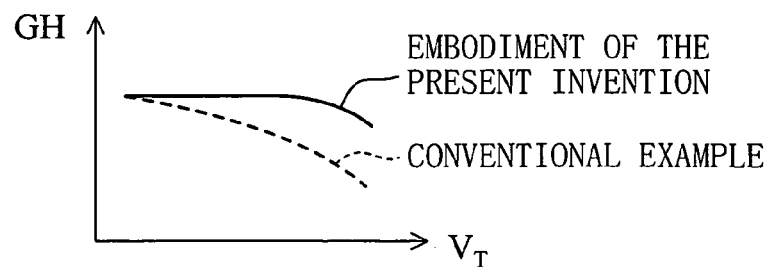
FIG. 4(d) is a diagram illustrating loop gain characteristics of the PLL frequency synthesizer.

Therefore, in the conventional example, as illustrated with a dashed line in FIG. 4(d), the characteristics of the loop gain GH(s) of the whole PLL frequency synthesizer monotonically decreases with an increase in the potential of the oscillation frequency control signal $V_T$, and the variation with respect to the oscillation frequency control signal $V_T$ is large. In the first embodiment of the present invention, the variation can be reduced due to the linearization circuit 8 as illustrated with a solid line in FIG. 4(d).

As described above, in the PLL frequency synthesizer of the first embodiment of the present invention, the linearization circuit 8 of FIG. 3 which has a considerably simple structure is only added, thereby making it possible to obtain substantially constant characteristics of the loop gain GH(s) of the whole PLL frequency synthesizer without depending on the potential level of the oscillation frequency control signal $V_T$. Therefore, the effect of reducing variations in lock time and phase noise characteristics of the PLL frequency synthesizer can be achieved over a broad band with a considerably small increase in circuit scale.

Second Embodiment

Next, a second embodiment of the present invention will be described. The second embodiment of the present invention is provided with a variation of the linearization circuit 6 of the first embodiment.

Figure 5:
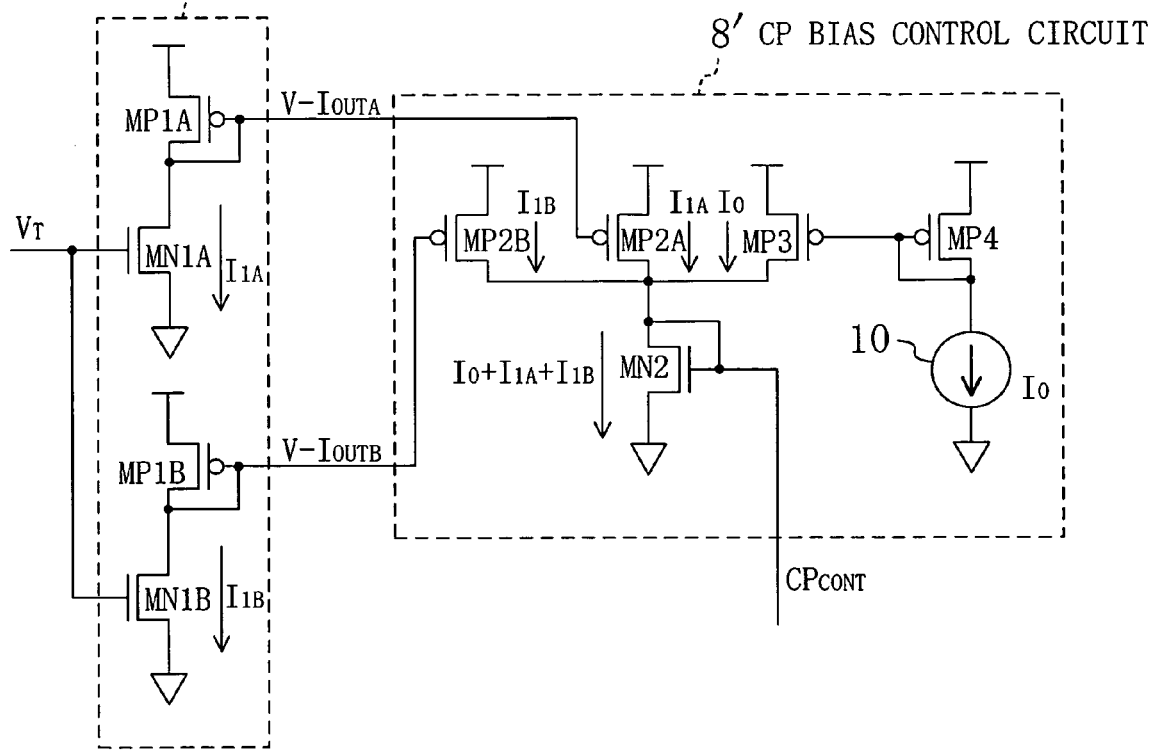
FIG. 5 is a diagram illustrating a specific structure of a linearization circuit included in a PLL frequency synthesizer according to a second embodiment of the present invention.
Figure 6:
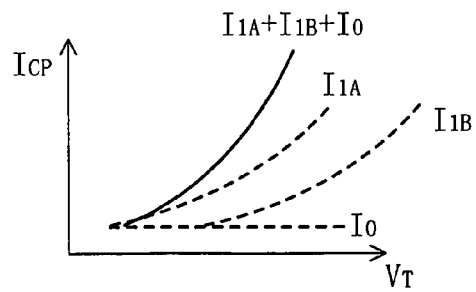
FIG. 6 is a diagram illustrating current characteristics of a charge pump included in the PLL frequency synthesizer.

Specifically, the linearization circuit 6' of FIG. 5 has a V-I conversion circuit 7' in which a series circuit of a P-type transistor MP1A and an N-type MN1A and a series circuit of a P-type transistor MP1B and an N-type MN1B are provided. The oscillation frequency control signal $V_T$ is input from the loop filter LF to a gate of each of the two N-type transistors MN1A and MN1B. Therefore, as is similar to the V-I conversion circuit 7 of FIG. 3, currents $I_{1A}$ and $I_{1B}$ flowing through the respective N-type transistors MN1A and MN1B of the two series circuits vary depending on the potential of the oscillation frequency control signal $V_T$ input to the respective gates. A CP bias control circuit 8' comprises two P-type transistors MP2A and MP2B for receiving a current. The two currents $I_{1A}$ and $I_{1B}$ flowing through the V-I conversion circuit 7' are input to the CP bias control circuit 8' due to a current mirror structure. The two input current $I_{1A}$ and $I_{1B}$ are added with a reference current $I_0$ as illustrated in FIG. 6, and the resultant sum current is input as a charge pump current control signal $CP_{CONT}$ from a gate electrode of the N-type transistor MN2 to the charge pump circuit CP of FIG. 1.

Here, in the V-I conversion circuit 7', the two N-type transistors MN1A and MN1B have different threshold voltages, so that the flowing current amounts $I_{1A}$ and $I_{1B}$ are different from each other due to a difference in current drive ability even if the bias voltage value (oscillation frequency control signal $V_T$) is the same. Therefore, in the second embodiment of the present invention, it is possible to more finely control the charge pump current control signal $CP_{CONT}$ from the CP bias control circuit 8' with respect to a change in the oscillation frequency control signal $V_T$. Therefore, the dependence of the charge pump current $I_{CP}$ on the potential of the oscillation frequency control signal $V_T$ can be made close to the sensitivity characteristics of the voltage control oscillator VCO, thereby making it possible to further reduce a variation in the PLL frequency synthesizer due to a change in the potential of the oscillation frequency control signal $V_T$.

Although, in the second embodiment of the present invention, the two N-type transistors MN1A and MN1B have different threshold voltages from each other so as to finely control the charge pump current control signal $CP_{CONT}$, three or more N-type transistors may be provided. In addition, a current flowing through each N-type transistor may be controlled using a parameter other than the threshold voltage so as to finely control the charge pump current control signal $CP_{CONT}$.

Third Embodiment

Next, a third embodiment of the present invention will be described. The third embodiment of the present invention is provided with another variation of the linearization circuit 6 of the first embodiment.

Figure 7:
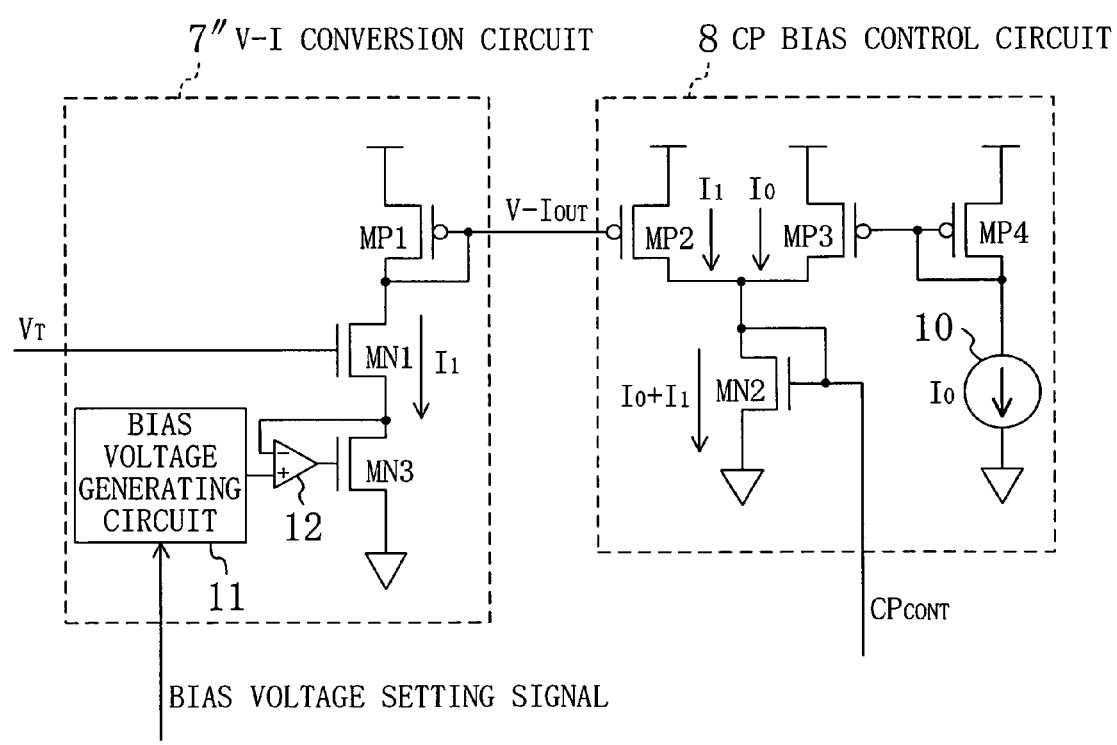
FIG. 7 is a diagram illustrating a specific structure of a linearization circuit included in a PLL frequency synthesizer according to a third embodiment of the present invention.

Specifically, the linearization circuit 6" of FIG. 7 has a V-I conversion circuit 7" in which an N-type transistor MN3 is provided between a source of an N-type transistor MN1 to a gate of which an oscillation frequency control signal $V_T$ is input, and a ground. An operational amplifier 12 is connected to a gate of the N-type transistor MN3. A source voltage of the N-type transistor MN1 and a bias voltage generated in a bias voltage generating circuit 11 are input to the operational amplifier 12. The operational amplifier 12 controls the N-type transistor MN3 so that a source voltage of the N-type transistor MN1 becomes equal to the bias voltage generated by the bias voltage generating circuit 11. Note that a CP bias control circuit 8 of FIG. 7 has the same structure as that of the CP bias control circuit 8 of FIG. 1.

Therefore, a current I1 flowing through the N-type transistor MN1 of the V-I conversion circuit 7" is determined, depending on the bias voltage of the bias voltage generating circuit 11 and the potential of the oscillation frequency control signal $V_T$ of the loop filter LF. Therefore, by setting the bias voltage of the bias voltage generating circuit 11 to be various values based on an externally input bias voltage setting signal, the charge pump current control signal $CP_{CONT}$ from the CP bias control circuit 8 can be more finely controlled than in the first and second embodiments, thereby making it possible to further suppress a variation in the loop gain of the PLL frequency synthesizer due to the potential of the oscillation frequency control signal $V_T$.

Fourth Embodiment

Further, a fourth embodiment of the present invention will be described. The fourth embodiment of the present invention is provided with a variation of the linearization circuit 6' of the second embodiment.

Figure 8:
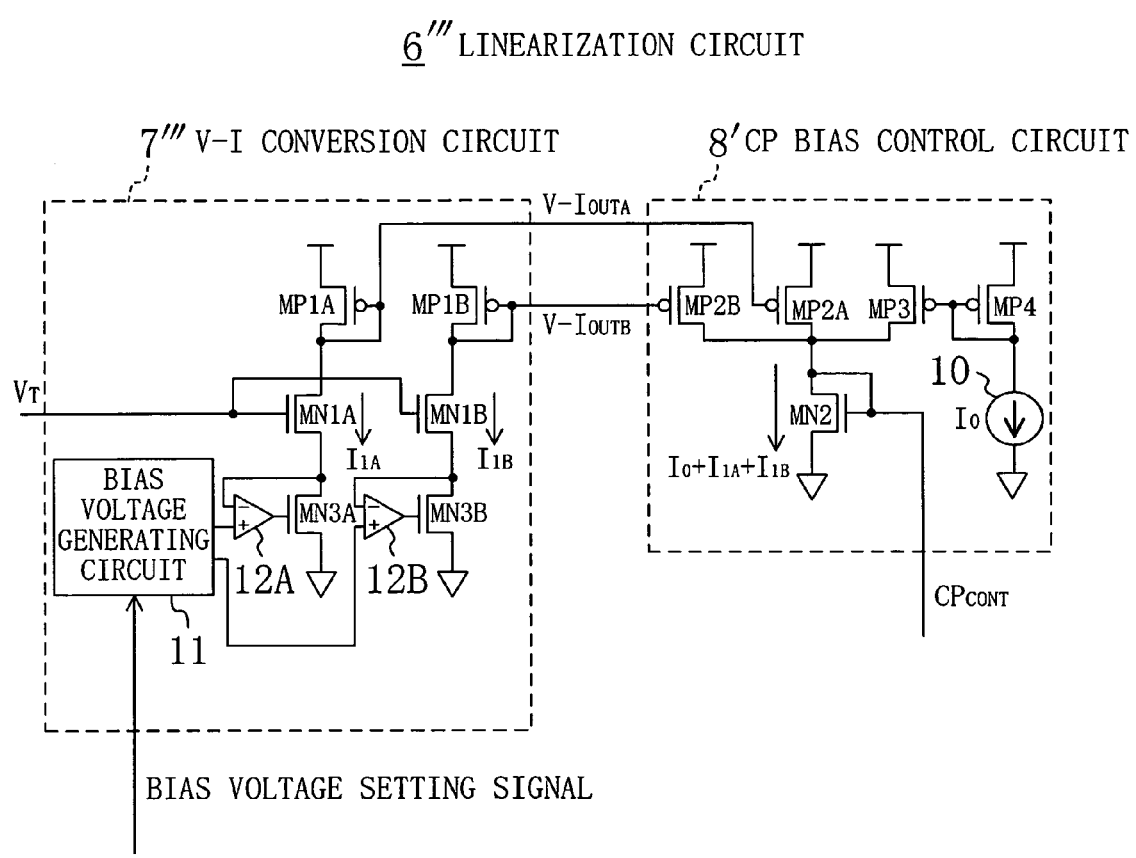
FIG. 8 is a diagram illustrating a specific structure of a linearization circuit included in a PLL frequency synthesizer according to a fourth embodiment of the present invention.

Specifically, the linearization circuit 6'" of FIG. 8 has an additional structure in which the V-I conversion circuit 7' of FIG. 5 is further provided with the bias voltage generating circuit 11 of FIG. 7. Specifically, in a V-I conversion circuit 7''', N-type transistors MN3A and MN3B are provided between sources of respective N-type transistors MN1A and MN1B to gates of which an oscillation frequency control signal $V_T$ is input, and a ground. Operational amplifiers 12A and 12B are connected to gates of the respective N-type transistors MN3A and MN3B. A source voltage of the N-type transistor MN1A and a first bias voltage of the bias voltage generating circuit 11 are input to the operational amplifier 12, while a source voltage of the N-type transistor MN1B and a second bias voltage of the bias voltage generating circuit 11 are input to the operational amplifier 12B.

Therefore, in the fourth embodiment of the present invention, by setting the threshold voltages of the N-type transistors MN1A and MN1B to obtain an appropriate current drive ability and controlling the first and second bias voltage values of the bias voltage generating circuit 11, a charge pump current $I_{CP}$ which satisfactorily compensates for the nonlinearity of the sensitivity of the voltage control oscillator VCO with respect to the oscillation frequency control signal $V_T$, can be generated, thereby making it possible to considerably suppress a variation in the loop gain characteristics of the whole PLL frequency synthesizer.

Although, in the fourth embodiment of the present invention, the number of the N-type transistors MN1A and MN1B to the gates of which the oscillation frequency control signal $V_T$ is input is two and the number of bias voltages generated by the bias voltage generating circuit 11 is two, the number of N-type transistors and the number of generated bias voltages may be each three or more.

Fifth Embodiment

Next, a fifth embodiment of the present invention will be described. The fifth embodiment of the present invention is provided with a variation of the linearization circuit 6'" of the second embodiment.

Figure 9:
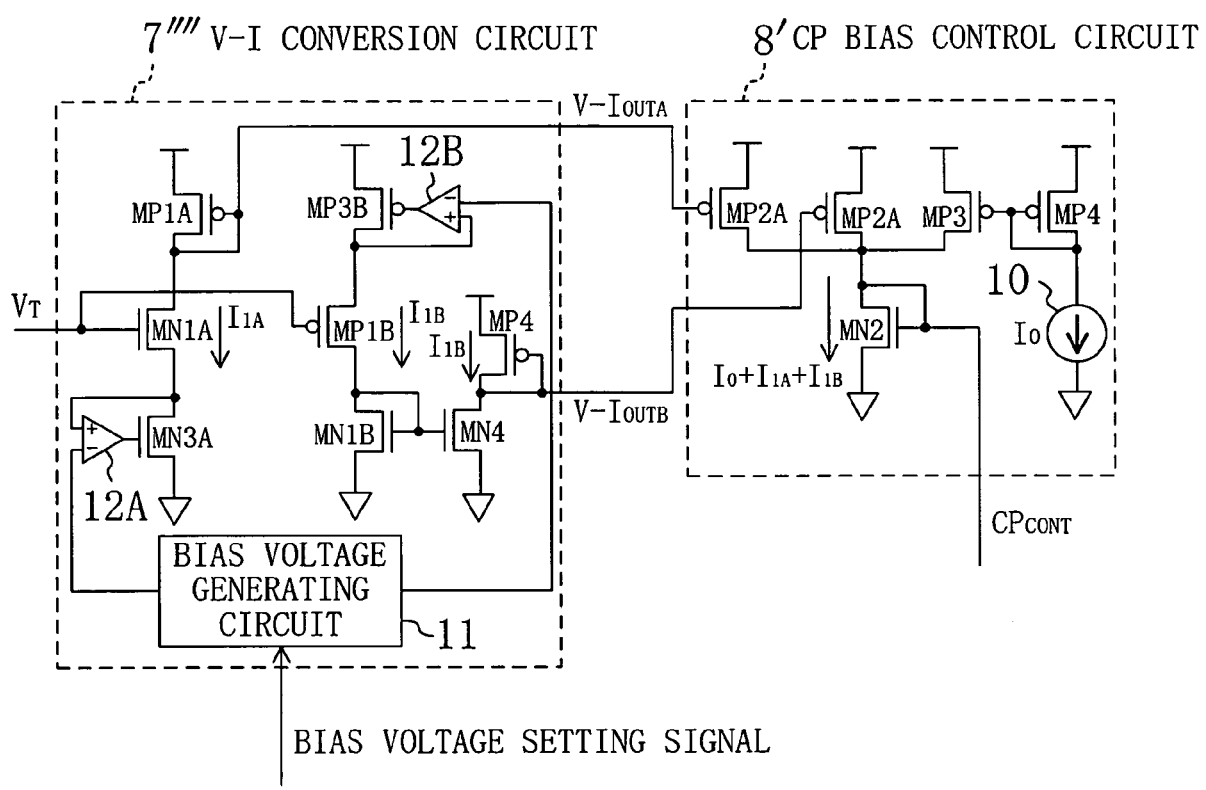
FIG. 9 is a diagram illustrating a specific structure of a linearization circuit included in a PLL frequency synthesizer according to a fifth embodiment of the present invention.

Specifically, the linearization circuit 6'" of FIG. 9 has a V-I conversion circuit 7'''' composed of two N-type transistors MN1A and P-type transistor MP1B to gates of which an oscillation frequency control signal $V_T$ is input. Further, the linearization circuit 6'" is further provided with P-type and N-type transistors MP4 and MN4 for outputting a current $I_{1B}$ flowing through a series circuit composed of the P-type transistor MP1B and the N-type transistor MN1B to the outside by means of a current mirror structure.

Therefore, in the fifth embodiment of the present invention, when the potential of the oscillation frequency control signal $V_T$ is increased to be larger than a bias voltage input to a source of the N-type transistor MN1A by a threshold voltage of the N-type transistor MN1A or more, a current flows through the N-type transistor MN1A. When the potential of the oscillation frequency control signal $V_T$ is decreased to be smaller than a bias voltage input to a source of the P-type transistor MP1B by a threshold voltage of the P-type transistor MP1B or more, a current flows through the P-type transistor MP1B.

Figure 10A:
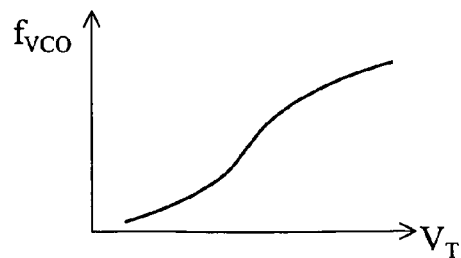
FIG. 10(a) is a diagram illustrating oscillation frequency characteristics of a voltage control oscillator included in the PLL frequency synthesizer of the fifth embodiment of the present invention.
Figure 10B:
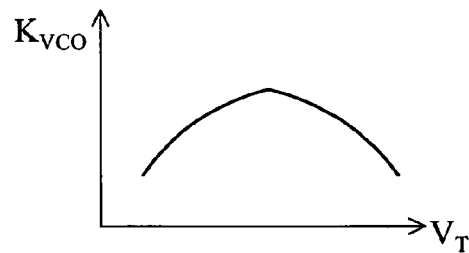
FIG. 10(b) is a diagram illustrating sensitivity characteristics thereof.
Figure 10C:
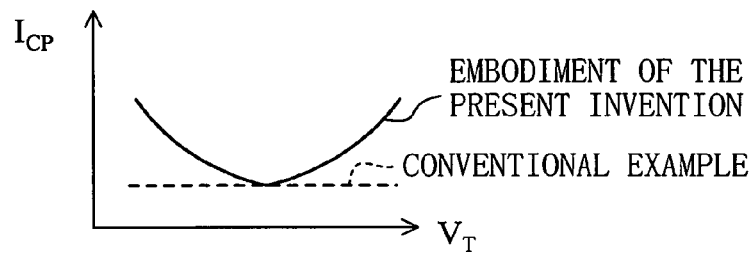
FIG. 10(c) is a diagram illustrating charge pump current characteristics thereof.
Figure 10D:
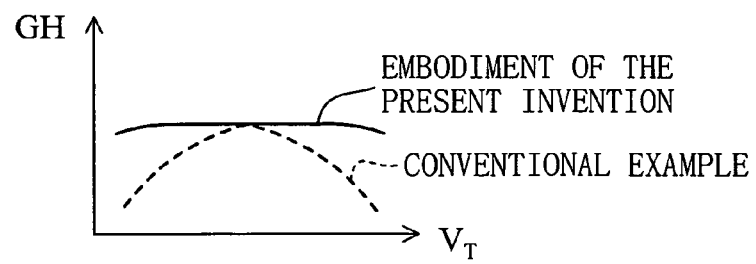
FIG. 10(d) is a diagram illustrating loop gain characteristics of the PLL frequency synthesizer.
Figure 11:
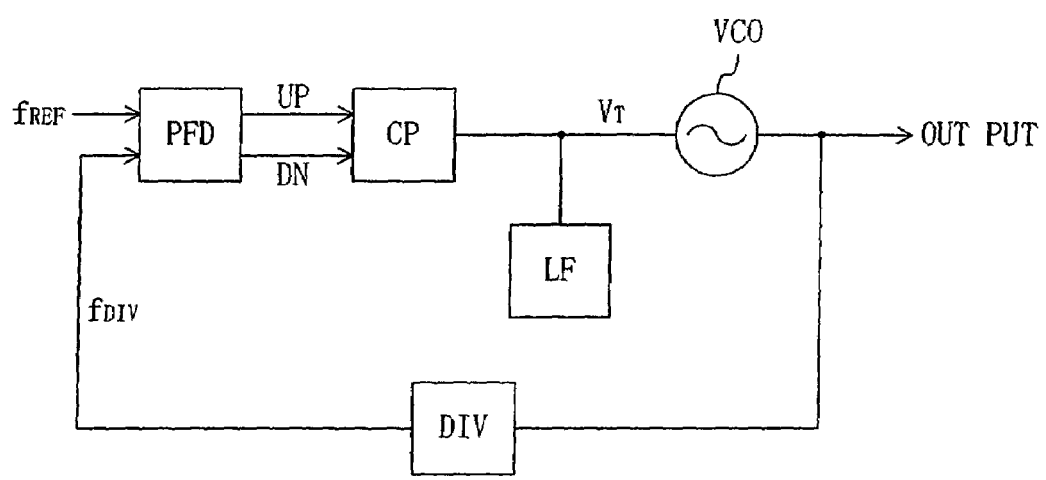
FIG. 11 is a diagram illustrating a structure of a conventional PLL frequency synthesizer.
Figure 12A:
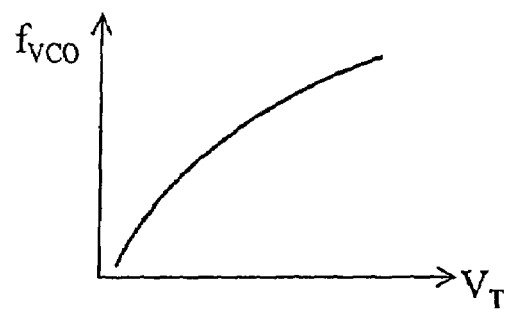
FIG. 12(a) is a diagram illustrating oscillation frequency characteristics of a voltage control oscillator included in the conventional PLL frequency synthesizer.
Figure 12B:
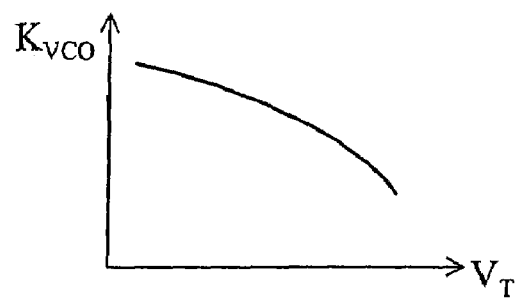
FIG. 12(b) is a diagram illustrating sensitivity characteristics thereof.
Figure 12C:
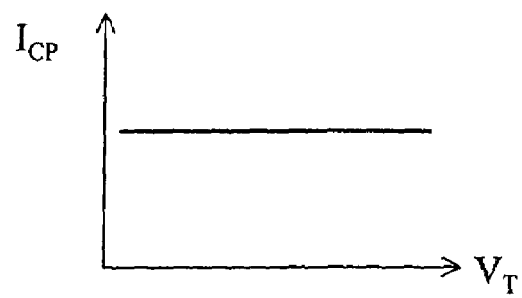
FIG. 12(c) is a diagram illustrating charge pump current characteristics thereof.
Figure 12D:
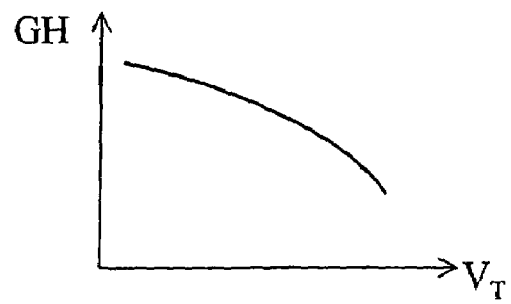
FIG. 12(d) is a diagram illustrating loop gain characteristics of the conventional PLL frequency synthesizer.

When a MOS-type variable capacitor is used as a variable capacitor, the oscillation frequency $f_{VCO}$ of a general voltage control oscillator VCO has characteristics as illustrated in FIG. 10(a), and the sensitivity $K_{VCO}$ thereof has characteristics as illustrated in FIG. 10(b). Here, the charge pump current $I_{CP}$ from the charge pump circuit CP which is controlled using the charge pump current control signal $CP_{CONT}$ from the CP bias control circuit 8' increases due to the current $I_{1B}$ flowing through the P-type transistor MP1B when the potential of the oscillation frequency control signal $V_T$ is low, as illustrated in FIG. 10(c). The charge pump current $I_{CP}$ also increases due to the current $I_{1A}$ flowing through the N-type transistor MN1A when the potential of the oscillation frequency control signal $V_T$ is high. Therefore, the charge pump current $I_{CP}$ compensates for the nonlinearity of the sensitivity characteristics of the voltage control oscillator VCO. As illustrated in FIG. 10(d), in a conventional example indicated with a solid line, characteristics of a loop gain GH(s) of the PLL frequency synthesizer vary largely, depending on a variation in the potential of the oscillation frequency control signal $V_T$. On the other hand, in the fifth embodiment of the present invention indicated with a solid line, the characteristics of the loop gain GH(s) of the PLL frequency synthesizer can have substantially a constant value with respect to the potential of the oscillation frequency control signal $V_T$ over a broad range, so that the effect of reducing a variation in the loop gain characteristics of the PLL frequency synthesizer is significant.

Note that an output bias voltage can be variably controlled by the bias voltage generating circuit 11 of FIGS. 7, 8, and 9 using an externally input bias voltage setting signal, and therefore, it is possible to set an optimal bias voltage, taking into consideration, for example, a variation in characteristics of the sensitivity $K_{VCO}$ of the voltage control oscillator VCO and a variation in current drive ability of a transistor constituting the linearization circuits 6", 6'", and 6"" when the PLL frequency synthesizer is manufactured.

INDUSTRIAL APPLICABILITY

As described above, according to the present invention, a linearization circuit which controls a conversion gain of a phase comparator and a charge pump circuit, depending on an oscillation frequency control signal from a loop filter, is used to compensate for the nonlinearity of the sensitivity characteristics of a voltage control oscillator with respect to the potential of an oscillation frequency control signal so that loop gain characteristics of a PLL frequency synthesizer are constant without depending on the potential of the oscillation frequency control signal. Therefore, the present invention is useful in applications, such as a PLL frequency synthesizer of a relatively broad band in the field of communications, and the like.

The invention claimed is:

1. A PLL frequency synthesizer comprising:
  a voltage control oscillator for changing an oscillation frequency, depending on a potential of an oscillation frequency control signal;
  a frequency divider for dividing an output signal from the voltage control oscillator with a predetermined frequency division ratio;
  a phase comparator for receiving an output signal from the frequency divider and an external reference signal, detecting a difference in phase between the output signal and the reference signal, and outputting a phase difference signal;
  a charge pump circuit for causing a constant current to flow in or out, depending on the phase difference signal from the phase comparator;
  a loop filter for filtering out a high frequency component of an output of the charge pump circuit, converting the current flowing into or out of the charge pump circuit into a voltage, and outputting the voltage as the oscillation frequency control signal; and
  a linearization circuit for controlling a gain of the charge pump circuit so as to compensate for nonlinearity of a loop gain of the PLL frequency synthesizer with respect to the oscillation frequency control signal,
  wherein the linearization circuit has a plurality of transistors for receiving the oscillation frequency control signal from the loop filter and changing flowing currents, depending on a potential of the oscillation frequency control signal, and
  the gain of the charge pump circuit is continuously controlled, depending on a sum of the currents flowing through the plurality of transistors.

2. The PLL frequency synthesizer of claim 1, wherein the plurality of transistors of the linearization circuit have different threshold voltages from each other.

3. A PLL frequency synthesizer comprising:
  a voltage control oscillator for changing an oscillation frequency, depending on a potential of an oscillation frequency control signal;
  a frequency divider for dividing an output signal from the voltage control oscillator with a predetermined frequency division ratio;
  a phase comparator for receiving an output signal from the frequency divider and an external reference signal, detecting a difference in phase between the output signal and the reference signal, and outputting a phase difference signal;
  a charge pump circuit for causing a constant current to flow in or out, depending on the phase difference signal from the phase comparator;
  a loop filter for filtering out a high frequency component of an output of the charge pump circuit, converting the current flowing into or out of the charge pump circuit into a voltage, and outputting the voltage as the oscillation frequency control signal; and
  a linearization circuit for controlling a gain of the charge pump circuit so as to compensate for nonlinearity of a loop gain of the PLL frequency synthesizer with respect to the oscillation frequency control signal,
  wherein the linearization circuit has a transistor for receiving the oscillation frequency control signal from the loop filter and changing a flowing current, depending on a potential of the oscillation frequency control signal,
  the linearization circuit has a bias voltage generating circuit for generating a bias voltage,
  a source voltage of the transistor of the linearization circuit is controlled to be the bias voltage of the bias voltage generating circuit, and the oscillation frequency control signal from the loop filter is input to a gate of the transistor of the linearization circuit, and
  the gain of the charge pump circuit is continuously controlled, depending on a value of the current flowing through the transistor.

4. The PLL frequency synthesizer of claim 3, wherein the transistor of the linearization circuit is composed of a plurality of transistors, and
  the gain of the charge pump circuit is continuously controlled, depending on a sum of currents flowing through the plurality of transistors.

5. The PLL frequency synthesizer of claim 4, wherein the bias voltage generating circuit generates a plurality of different bias voltages, and
  the different bias voltages from the bias voltage generating circuit are input to respective sources of the plurality of transistors of the linearization circuit.

6. The PLL frequency synthesizer of claim 5, wherein the bias voltage generating circuit changes the plurality of generated bias voltages based on an externally input bias voltage setting signal.

* * * * *